United States Patent
Huerlimann

(10) Patent No.: US 10,989,883 B2
(45) Date of Patent: Apr. 27, 2021

(54) CONNECTOR ARRANGEMENTS AND METHODS OF MONITORING CONNECTOR ARRANGEMENTS

(71) Applicant: TRUMPF Schweiz AG, Gruesch (CH)

(72) Inventor: Thomas Huerlimann, Bad Ragaz (CH)

(73) Assignee: TRUMPF Schweiz AG, Gruesch (CH)

( * ) Notice: Subject to any disclaimer, the term of this patent is extended or adjusted under 35 U.S.C. 154(b) by 0 days.

(21) Appl. No.: 16/670,196

(22) Filed: Oct. 31, 2019

(65) Prior Publication Data

US 2020/0064565 A1 Feb. 27, 2020

Related U.S. Application Data

(63) Continuation of application No. PCT/EP2018/060334, filed on Apr. 23, 2018.

(30) Foreign Application Priority Data

May 3, 2017 (EP) ..................................... 17169296

(51) Int. Cl.
*G02B 6/38* (2006.01)
*G02B 6/42* (2006.01)
(Continued)

(52) U.S. Cl.
CPC ......... *G02B 6/3895* (2013.01); *G01R 15/144* (2013.01); *G02B 6/4283* (2013.01);
(Continued)

(58) Field of Classification Search
CPC .. G02B 6/3895; G02B 6/4296; G02B 6/4283; G02B 6/4292; G02B 6/3624;
(Continued)

(56) References Cited

U.S. PATENT DOCUMENTS 6,212,052 B1 4/2001 Heuer et al.
6,554,484 B2 * 4/2003 Lampert .............. G02B 6/3895
385/70

(Continued)

FOREIGN PATENT DOCUMENTS

DE 42 29 566 3/1994
DE 199 50 764 9/2001
(Continued)

OTHER PUBLICATIONS

The European Search Report for European Application No. EP 17 16 9296 dated Oct. 23, 2017.
(Continued)

*Primary Examiner* — Leslie C Pascal
(74) *Attorney, Agent, or Firm* — Fish & Richardson P.C.

(57) ABSTRACT

The disclosure relates to a connector arrangement having a first connector part and a second connector part, the second connector part being in the form of a receiving connector part having a receiver, and the receiver being connected to a first sensing device for sensing the signal received by the receiver. The connector arrangement is characterized in that the first connector part is in the form of a transmitting connector part that has a transmitter for the contactless transmission of a signal.

18 Claims, 2 Drawing Sheets

(51) Int. Cl.
*H04B 10/07* (2013.01)
*G01R 15/14* (2006.01)

(52) U.S. Cl.
CPC ......... *G02B 6/4292* (2013.01); *G02B 6/4296* (2013.01); *H04B 10/07* (2013.01); *H04B 2210/08* (2013.01)

(58) Field of Classification Search
CPC ............ G02B 2006/4297; H04B 10/07; H04B 2210/08; G01R 15/144
See application file for complete search history.

(56) References Cited

U.S. PATENT DOCUMENTS

| | | |
|---|---|---|
| 7,239,780 B2 | 7/2007 | Notheis et al. |
| 2002/0018257 A1 | 2/2002 | Notheis |
| 2002/0081076 A1 | 6/2002 | Lampert et al. |
| 2002/0081080 A1* | 6/2002 | Balle-Petersen ..... G02B 6/4296 385/93 |
| 2008/0071146 A1* | 3/2008 | Caylor ................. A61B 5/0031 600/300 |
| 2019/0107678 A1* | 4/2019 | Anderson ............ G02B 6/3807 |
| 2020/0341218 A1* | 10/2020 | Leclair .................... G06F 1/185 |

FOREIGN PATENT DOCUMENTS

| | | |
|---|---|---|
| EP | 0 986 176 | 3/2000 |
| EP | 1 731 938 | 12/2006 |
| EP | 1 811 715 | 7/2007 |
| WO | WO 2009/103174 | 8/2009 |

OTHER PUBLICATIONS

The International Search Report and Written Opinion of the International Searching Authority for International Application No. PCT/EP2018/060334 dated Jul. 11, 2018.

* cited by examiner

CONNECTOR ARRANGEMENTS AND METHODS OF MONITORING CONNECTOR ARRANGEMENTS

CROSS REFERENCE TO RELATED APPLICATIONS

This application is a continuation of and claims priority under 35 U.S.C. § 120 from PCT Application No. PCT/EP2018/060334, filed on Apr. 23, 2018, which claims priority from European Patent Application No. 17 169 296.5, filed on May 3, 2017. The entire contents of each of these priority applications are incorporated herein by reference.

TECHNICAL FIELD

The disclosure relates to connector arrangements including a first connector part and a second connector part, the second connector part being in the form of a receiving connector part including a receiver, and the receiver being connected to a first sensing device for sensing the signal received by the receiver.

BACKGROUND

Light conductors, in particular optical fibers, are often used to transport laser light. The light conductors are connected by means of connectors. When a connector of this kind is disconnected, one must ensure that the light source is also switched off, because the light output may be harmful, and in particular may cause eye damage to a user.

Monitoring a connector by means of a contact ring that short-circuits two contacts is known. However, contact-based connector monitoring is prone to error.

US 2002/0081076 A1 discloses providing a permanent magnet on a connector part and providing a Hall-effect sensor in a connector part. Although this makes it possible to ascertain in a contact-free manner whether or not a connector is plugged in, this type of monitoring cannot detect whether the Hall-effect sensor is defective and this may lead to the laser generator not being reliably switched off.

SUMMARY

The problem addressed by the present disclosure is that of providing a connector arrangement that makes it possible to implement a safety function such that an improper connection is reliably detected, and a beam source is reliably switched off if the connection is faulty. The disclosure relates to methods of monitoring a connector, in which a temporally variable signal is contactlessly transmitted by a transmitter of a transmitting connector part and received by a receiver of a receiving connector part.

According to the disclosure, the problem is solved by a connector arrangement that includes a first connector part and a second connector part, wherein the second connector part is in the form of a receiving connector part including a receiver, and wherein the receiver is connected to a first sensing device for sensing a signal received by the receiver, and the first connector part is in the form of a transmitting connector part that has a transmitter for the contactless transmission of a signal. A connector arrangement of this kind allows dynamic monitoring. In particular, the use of a transmitter allows a temporally variable signal to be transmitted, unlike when a permanent magnet is used. A measure of this kind makes it possible to monitor whether the receiver is functioning reliably.

For example, the connector arrangement is designed such that a useful signal, for example a laser light signal, can be transmitted by means of the connector arrangement, and a second signal is contactlessly transmitted to the receiver by the transmitter to monitor the connector arrangement. However, the connector arrangement can also have a light conductor that transmits both the useful signal and the second signal. The second signal may be modulated onto the light signal, for example.

The receiver can be connected to a second sensing device for sensing the signal received by the receiver. It is thus possible to perform two-channel monitoring. If a fault is detected in one of the channels, this can automatically lead to a beam source, such as a light source, being switched off.

The first and/or second sensing device(s) may each be connected to a separate analysis device designed to compare the signal sensed by the particular sensing device with a reference signal. In this case, the reference signal can be used to determine the signal to be transmitted. In particular, it is possible to monitor whether the signal sensed by the sensing devices has the same waveform as the reference signal. By using separate analysis devices, the functioning of each sensing device can be checked and monitored.

The analysis devices can be interconnected for data transfer. For example, the analysis devices may be connected via a data bus. As a result, the analysis devices can monitor one another and also exchange the results of the comparison of the sensed signal with the reference signal.

Both the transmitting connector part and the receiving connector part may have a light conductor. As a result, the connector arrangement is suitable for laser applications. The light conductor may be suitable for transporting power in laser processing, for example, a multi-mode waveguide, photonic-crystal fiber (PCF) waveguide, or hollow-core waveguide having corresponding damage thresholds.

The transmitting connector part may be arranged at the end of a fiber optic cable having a light conductor, and a signal line extending along the fiber optic cable may be provided. The signal line can be in the form of an electrical or optical line. For example, the signal line may extend in the cladding of the cable. In particular, the signal line may extend in parallel with the light conductor. Alternatively, the light conductor can be used for signal transmission.

A signal generator can be provided that is connected to the transmitter and connected to at least one analysis device for data transfer. In this way, the analysis device can be informed via the data connection which signal is generated by the signal generator such that the analysis device knows which received signal to anticipate and can thus assess whether the signal transmitted by the transmitter has been received by the receiver. In particular, as a result of the data connection of the signal generator to the analysis device, the reference signal or one or more parameters describing the reference signal can be transmitted. Since in the case of multiple analysis devices the analysis devices are also interconnected for data transfer, the reference signal, or one or more parameters describing the reference signal, can be transmitted from one analysis device to the other such that the other analysis device can also assess whether the associated receiver receives the correct signal, which substantiates that the connector arrangement is intact.

The transmitter can include or be a coil, and the receiver can include or be a Hall-effect sensor. This embodiment is advantageous if the transmitter and/or receiver is/are surrounded by non-magnetic material. The magnetic field can penetrate non-magnetic materials, such as plastic materials, aluminum, and stainless steel. In particular, a low-frequency signal can be transmitted by the coil and received by the Hall-effect sensor. This type of signal transmission is more reliable than a radio frequency identification (RFID) coupling in which high-frequency signals are transmitted. In particular, the transmitter in the form of a coil can generate a magnetic field on the basis of the current direction and the amperage. For example, a Hall-effect sensor can react to the generated magnetic field and output a voltage signal proportional to the magnetic field strength. If the signal profile of the voltage signal matches the signal profile of the modulated coil current, the connector is in working order. In addition, the monitoring solution is advantageous in that the cable connected to a connector part is monitored over the entire transport path of the light.

If the two lines are short-circuited for any reason (e.g., if a fiber of the shield breaks, for example due to mechanically continuous loading, and breaks through the insulation, a short circuit forms), a current will no longer flow via the coil. Thus, a signal will no longer reach the receiver either, and the beam source will be switched off.

In some embodiments, the coil can have a soft magnetic core. This measure increases the magnetic flux density.

The analysis devices can be in the form of microcontrollers, which are inexpensive, reliable, and often already present in the vicinity of connector arrangements and can be used to monitor the connector arrangement. In particular, the signal received by the receiver can be compared by two independent microcontrollers. If the signal profile of the received signal matches the current generated in the coil, the connector is in working order. Failing that, the associated beam source generating the signal to be transmitted by the connector arrangement is switched off as a fault reaction.

The signal generator can include a microcontroller. The microcontroller can define the waveform of the signal to be transmitted by the transmitter. In particular, the microcontroller can control a power supply source, e.g., a current source, and thus define the direction and amperage of the current that flows through the transmitter in the form of a coil. In particular, a temporally variable signal can be generated in this way.

In some embodiments, only two microcontrollers are provided. As a result, the number of components can be reduced. The two microcontrollers can be arranged on either the transmission side or the reception side, i.e., in the vicinity of the transmitting connector part or in the region of the receiving connector part.

Alternatively, two microcontrollers can be respectively provided on the transmission side and on the reception side. The reception-side and transmission-side microcontrollers can be connected via a data bus. In this way, only data, and no analog signals, have to be transmitted, meaning that separate analog transmission lines are not required. Microcontrollers already present on the receiver side can be used. This embodiment is less prone to error than if only two transmission-side microcontrollers are used. In this case, an analog signal, namely the received signal, would have to be transmitted back to the transmission side.

The transmitter and/or the receiver can be protected by a non-magnetic material in the particular connector part. In this way, the transmitter and/or the receiver is/are mechanically protected, thus achieving a robust connector. Plastic materials, aluminum, and certain steels, for example, can be used for the non-magnetic material.

In another aspect, the disclosure also includes methods for monitoring a connector, in which a temporally variable signal is contactlessly transmitted by a transmitter of a transmitting connector part and received by a receiver of a receiving connector part, wherein the signal received by the receiver is sensed by at least one, preferably two independent sensing devices and is supplied to respective analysis devices. Contactless transmission of a signal is advantageous over a contact-based transmission, because contactless transmission is less susceptible to interference due to dirt and faulty contacts. An electrical or optical signal can be contactlessly transmitted. In particular, if two sensing devices and respective associated analysis devices are provided, it is possible to perform two-channel monitoring, thus increasing monitoring reliability. By a temporally variable signal being transmitted, it is also possible, when there are multiple plug-in options, to check the allocation and to establish whether the correct connector part has been plugged in.

In some embodiments, the temporally variable signal can be transmitted continuously by the transmitter.

The analysis device can check whether the sensed signal corresponds to an anticipated signal. For this purpose, it is helpful if the analysis devices know which signal is to be transmitted.

Depending on the analysis, a device connected to the connector may be switched off. In particular, the device, for example a beam source, can be switched off if the received or sensed signal does not correspond to an anticipated signal. In particular, the device can be switched off if one of the analysis devices recognizes that the received signal does not match a transmitted signal, or a signal is not received.

Further features and advantages of the disclosure will become apparent from the claims and the following description of an embodiment of the invention, with reference to the drawings, which show the individual aspects that are essential to the invention. The features shown in the drawings are not to be interpreted to be necessarily to scale and are presented so that the specific aspects essential to the invention can be clearly visualized. In variants of the invention, the various features may be implemented in isolation or in groups in any desired combinations.

DESCRIPTION OF DRAWINGS

The schematic drawings show an embodiment of the invention, which is described in more detail in the following description.

DETAILED DESCRIPTION

Figure 1:
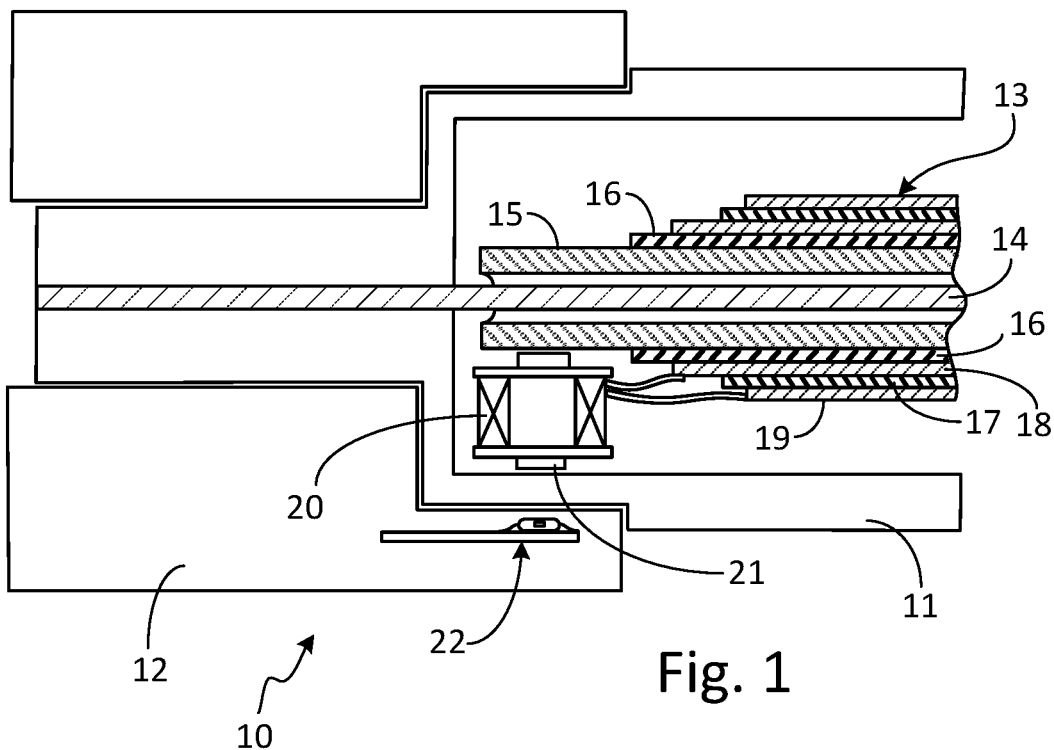
FIG. 1 is a schematic diagram in partial cross-section of an embodiment of a part of a connector arrangement as described herein.

FIG. 1 shows a part of a connector arrangement 10 including a transmitting connector part 11 and a receiving connector part 12. The transmitting connector part 11 is plugged into the receiving connector part 12. In the embodiment shown, the transmitting connector part 11 has a fiber optic cable 13 including a light conductor 14. The light conductor 14 is arranged in a protection coil 15, which, in turn, is radially externally adjoined by insulation 16. A signal line 18 in the form of a shield is arranged between the insulation 16 and the insulation 17. The insulation 17, in turn, is surrounded by a second signal line 19 in the form of a shield. The light conductor 14 is thus surrounded by a sheath, and the signal lines 18 and 19 extending parallel to the light conductor 14 in the sheath. A transmitter 20 having a coil is connected to a signal generator (not shown) by the signal line 18 and the signal line 19.

The coil of the transmitter 20 has a soft magnetic core 21. By means of the transmitter 20, a temporally variable signal can be contactlessly transmitted to a receiver 22 in the receiving connector part 12. The receiver 22 has a Hall-effect sensor in the embodiment shown.

The light conductor 14 extends inside the transmitting connector part 11 into the receiving connector part 12. By means of the connector arrangement 10, it is thus possible to transmit an optical signal, in particular laser light.

Figure 2:
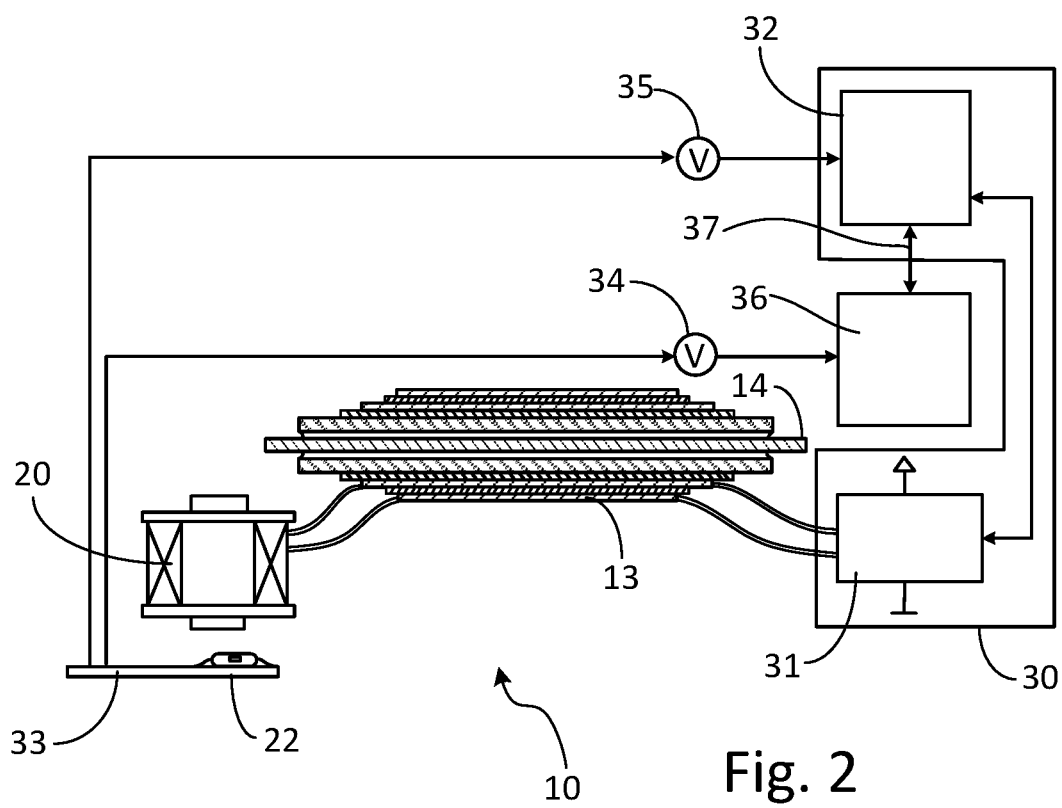
FIG. 2 is a circuit diagram and schematic diagram in partial cross-section that shows a part of the connector arrangement of FIG. 1, together with further components of the connector arrangement.

FIG. 2 shows the components of the connector arrangement 10 required to transmit a connection monitoring signal. The actual connector parts 11, 12 are not shown.

It can be seen here that a signal generator 30 is connected to the transmitter 20 via the signal lines 18, 19 of the fiber optic cable 13. The signal generator 30 has a power supply source 31, e.g., a current source, which is controlled by an analysis device 32 using a pulse pattern. As a result, a temporally variable signal is generated, which is transmitted via the signal lines 18, 19 in parallel with the light conductor 14. The current source 31 could alternatively be in the form of an H bridge.

The receiver 22 having a Hall-effect sensor that is arranged on a sensor circuit board 33 receives a signal transmitted by the transmitter 20. In particular, the transmitter 20 generates a temporally variable electromagnetic field since a temporally variable current is fed to the transmitter 20 by the signal generator 30. The signal received by the receiver 22 is sensed by two sensing devices 34, 35. The sensed signal is relayed to analysis devices 32, 36 where the signal is compared with a reference signal, in particular the signal that was generated by the signal generator 30. So that the analysis device 36 is also aware of the reference signal, the analysis devices 32, 36 are interconnected for data transfer, in particular via a Controller Area Network (CAN) bus 37. Furthermore, the analysis devices 32, 36 can also exchange comparison results via the data connection. The analysis devices 32, 36 are connected to a beam source (not shown) that can be switched off by either of the analysis devices 32, 36 if the sensed signal does not match the reference signal.

For the signal comparison, it is sufficient for the waveforms to be compared.

Figure 3A:
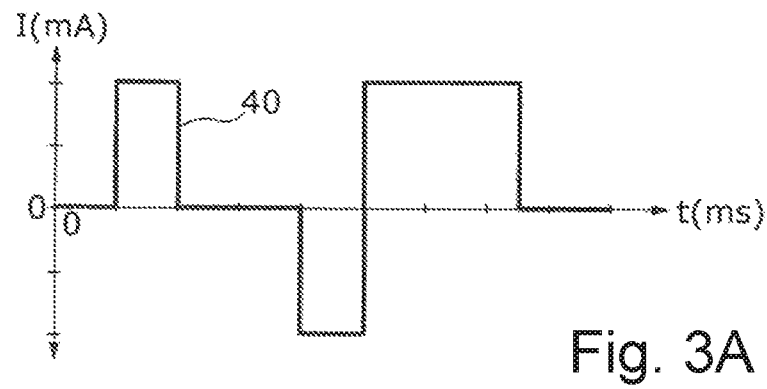
FIG. 3A is a graph that shows the waveform of a signal that is supplied to a transmitter as described herein.
Figure 3B:
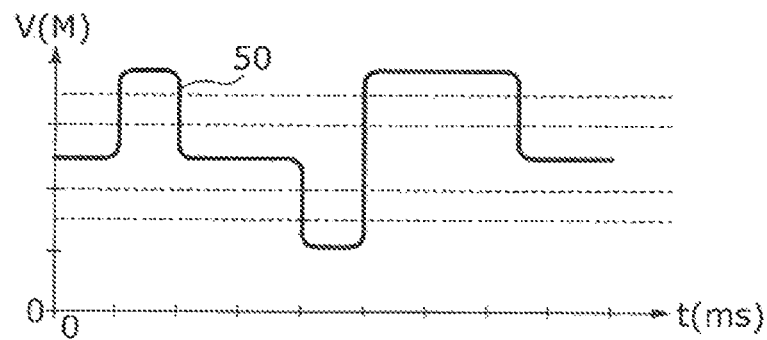
FIG. 3B is a graph that shows the waveform that is sensed by a sensing device on the reception side as described herein.

FIG. 3A shows a temporally variable current 40 generated by the signal generator 30, by way of example. If the current 40 is fed to the coil of the transmitter 20, a temporally variable electromagnetic field is produced. The electromagnetic field can be sensed by the receiver 22 such that a temporally variable voltage 50 is output by the sensing devices (see above) 34, 35 as a received signal. The signals 40, 50 can be compared by the analysis devices 32, 36. In this embodiment shown, the signals have the same waveform, which substantiates that the connector is in working order.

By two sensing devices (see above) 34, 35 being provided with associated analysis devices 32, 36, the analysis is performed on a two-channel basis. This increases the reliability of the monitoring of the connector.

Figure 4:
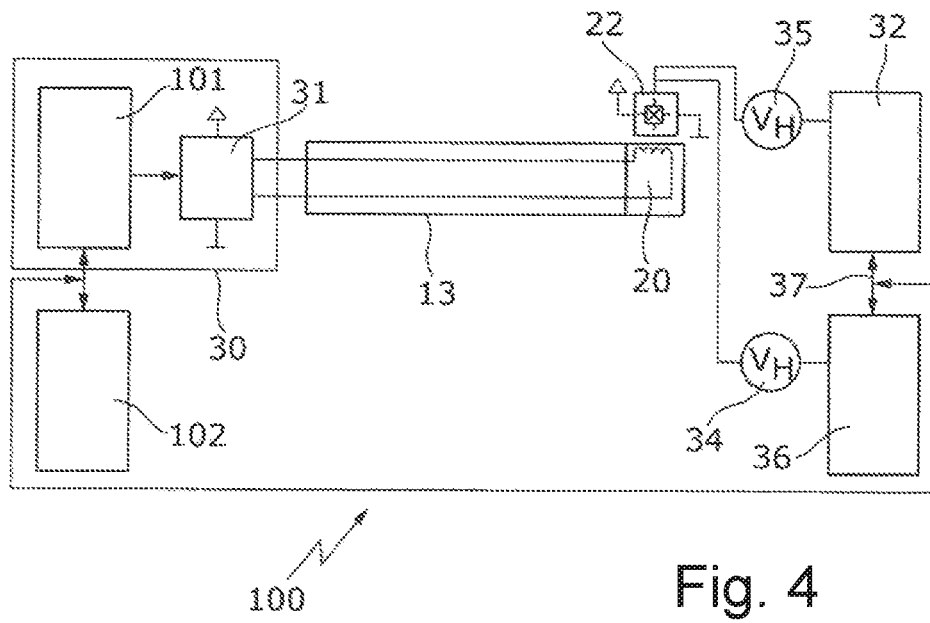
FIG. 4 is a schematic and circuit diagram of an alternative embodiment of a connector arrangement as described herein.

FIG. 4 shows an alternative embodiment of a connector arrangement 100. The components corresponding to the components corresponding to FIG. 2 are provided with the same reference numerals. In this case, the analysis devices 32, 36 are arranged on the receiver side. Not only are the analysis devices 32, 36 interconnected for data transfer via a data bus 37, but the analysis units 101, 102 provided on the input side are also interconnected. The analysis unit 101 is part of the signal generator 30, which in turn has a current source 31 that is connected to the fiber optic cable 13. The analysis units 32, 36, 101, 102 are all in the form of microcontrollers. All the microcontrollers can be interconnected for data transfer and can accordingly exchange data with one another.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A connector arrangement, comprising
a first connector part comprising a light conductor and a transmitter for contactless transmission of a connection monitoring signal, wherein the connection monitoring signal is separate from and different than a useful signal passing through the light conductor;
a second connector part comprising a light conductor and a receiver arranged to receive the connection monitoring signal from the transmitter;
a first sensing device connected to the receiver and configured to sense the connection monitoring signal received by the receiver; and
a second sensing device connected to the receiver and configured to sense the connection monitoring signal received by the receiver.

2. The connector arrangement of claim 1, further comprising one or more analysis devices, wherein at least one of the first and second sensing devices is connected to a separate analysis device designed to compare the signal sensed by the particular sensing device with a reference signal.

3. The connector arrangement of claim 2, further comprising two or more analysis devices, wherein the two or more analysis devices are interconnected for data transfer.

4. The connector arrangement of claim 2, further comprising a connection monitoring signal generator connected to the transmitter and connected to at least one of the one or more analysis devices for data transfer.

5. The connector arrangement of claim 4, wherein the connection monitoring signal generator comprises a microcontroller.

6. The connector arrangement of claim 2, wherein each of the one or more analysis devices comprises a microcontroller.

7. The connector arrangement of claim 1, wherein the useful signal comprises a light signal and wherein the second, connection monitoring signal comprises an electrical signal.

8. The connector arrangement of claim 1, wherein the useful signal comprises a light signal and wherein the second, connection monitoring signal comprises a second light signal modulated onto the useful light signal, and both signals are transmitted through the light conductor.

9. The connector arrangement of claim 1, wherein the first and second sensing devices are voltage sensors.

10. The connector arrangement of claim 1, wherein the first and second sensing devices are light sensors.

11. The connector arrangement of claim 1, wherein the first connector part is arranged at the end of a fiber optic cable comprising a light conductor and a connection monitoring signal line extending along the fiber optic cable.

12. The connector arrangement of claim 1, wherein the transmitter comprises a coil and the receiver comprises a Hall-effect sensor.

13. The connector arrangement of claim 1, further comprising two microcontrollers arranged on either a transmission side of the connector arrangement or on a reception side of the connector arrangement.

14. The connector arrangement of claim 1, further comprising two microcontrollers respectively arranged on a transmission side of the connector arrangement and on a reception side of the connector arrangement.

15. The connector arrangement of claim 1, wherein either one or both of the transmitter and the receiver are protected by a non-magnetic material.

16. A method for monitoring a connector, the method comprising
transmitting a first, optical signal through a first light conductor of a first connector part of the connector;
contactlessly transmitting a temporally variable second, connection monitoring signal by a transmitter of the first connector part;
receiving the first optical signal through a second light conductor of a second connector part of the connector;
receiving the temporally variable second, connection monitoring signal by a receiver of the second connector part;
sensing the second, connection monitoring signal received by the receiver by two independent sensing devices; and
supplying the second, connection monitoring signal to one or more respective analysis devices.

17. The method of claim 16, further comprising checking with the one or more analysis devices whether the sensed second, connection monitoring signal corresponds to an anticipated signal.

18. The method of claim 17, further comprising switching off a device connected to the connector arrangement when the sensed second, connection monitoring signal fails to correspond to the anticipated signal.

* * * * *